United States Patent [19]

Barth et al.

[11] 4,128,357

[45] Dec. 5, 1978

[54] SLAB-ELEMENTS FOR COVERING THE GROUND

[76] Inventors: Günter Barth, 41 Grötzingen, 7500 Karlsruhe; Fritz Von Langsdorff, Blumenstrasse 12, 7551 Förch, über Rastatt, both of Fed. Rep. of Germany

[21] Appl. No.: 882,250

[22] Filed: Feb. 28, 1978

Related U.S. Application Data

[63] Continuation-in-part of Ser. No. 672,727, Apr. 1, 1976, abandoned.

[30] Foreign Application Priority Data

Mar. 25, 1977 [DE] Fed. Rep. of Germany ....... 2713354
Mar. 29, 1976 [BE] Belgium ................................ 165663

[51] Int. Cl.² .............................................. E01C 5/00
[52] U.S. Cl. ........................................ 404/41; 52/608; D25/92
[58] Field of Search .................. 404/41, 42, 22, 44, 404/38, 23, 39, 43, 24, 45, 34; 52/608, 604, 603, 590; D25/92, 93, 88

[56] References Cited

U.S. PATENT DOCUMENTS

| 449,739 | 4/1891 | Hazelton | 404/41 |
|---|---|---|---|
| 474,339 | 5/1892 | Graham | 404/41 |
| 710,062 | 9/1902 | Leary | 404/34 |
| 801,108 | 10/1905 | Romanoff | D25/92 X |
| 1,474,779 | 11/1923 | Kammer | 52/590 |
| 1,595,686 | 8/1926 | Perry | 404/42 |
| 1,622,103 | 3/1927 | Fulton | 404/42 X |
| 2,708,329 | 5/1955 | McKee | 52/608 X |
| 3,466,986 | 9/1969 | Biller | 404/41 |
| 3,891,340 | 6/1975 | Bolli | 404/34 |
| 3,897,164 | 7/1975 | Dodino | 404/41 |

FOREIGN PATENT DOCUMENTS

| 497010 | 11/1950 | Belgium | 404/41 |
|---|---|---|---|
| 2409188 | 9/1975 | Fed. Rep. of Germany | 404/41 |
| 2609234 | 9/1977 | Fed. Rep. of Germany | 404/42 |
| 718846 | 11/1931 | France | 404/41 |
| 720620 | 12/1931 | France | 404/41 |
| 8041 of | 1839 | United Kingdom | 404/41 |

Primary Examiner—Nile C. Byers, Jr.
Attorney, Agent, or Firm—Albert C. Johnston

[57] ABSTRACT

A slab element for covering the ground is made e.g. of concrete and forms as a single piece. It has a head portion and a stem portion meeting at a notional meeting surface. The element is delimited by two opposite end faces of equal length joined by sides that form angled traces about a longitudinal axis common to the head at the stem, each said angled trace being formed by a succession of sides comprising at said head an inclined side face inclined in one direction relatively to the axis, a lateral side face extending lengthwise with respect to the axis and another inclined side face inclined in the opposite direction with respect to the axis, and comprising at the stem a lateral side face extending lengthwise with respect to the axis which is complementary to the lateral face of the head, the end face of the head together with its inclined sides and its lateral faces and the meeting surface describing a centrally symmetrical octagon, and the meeting surface together with the end face and lateral faces of the stem being symmetrical about the center of the stem. The head may describe a regular octagon. The stem may describe a square. But the stem may also describe a circle. The elements can be laid to form a composite ground covering structure, laid e.g. in herringbone bond pattern, and laid e.g. to include one or more supplementing slab elements of the same peripheral configuration as the stems of the elements.

28 Claims, 27 Drawing Figures

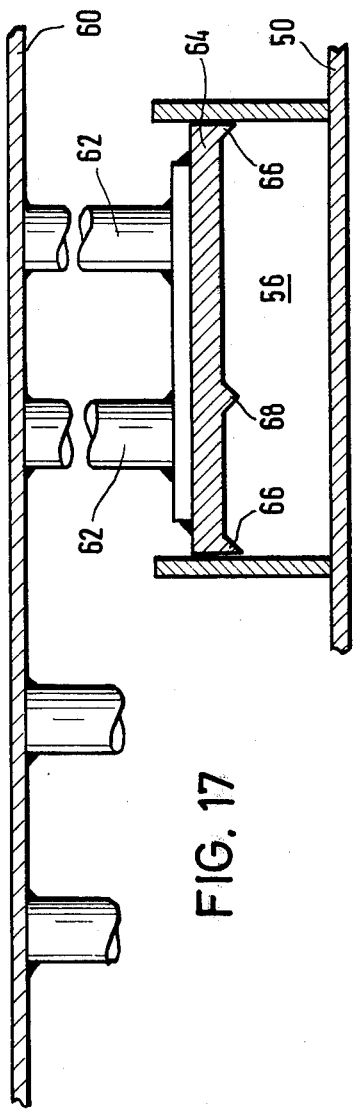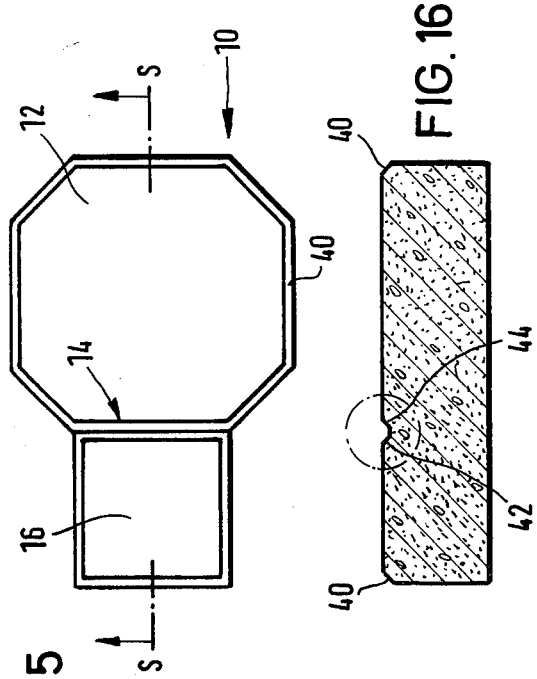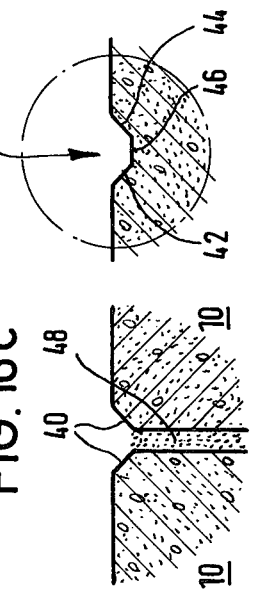

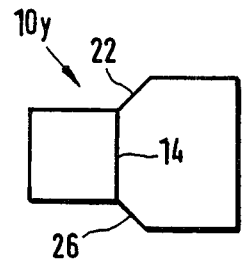
FIG. 20d
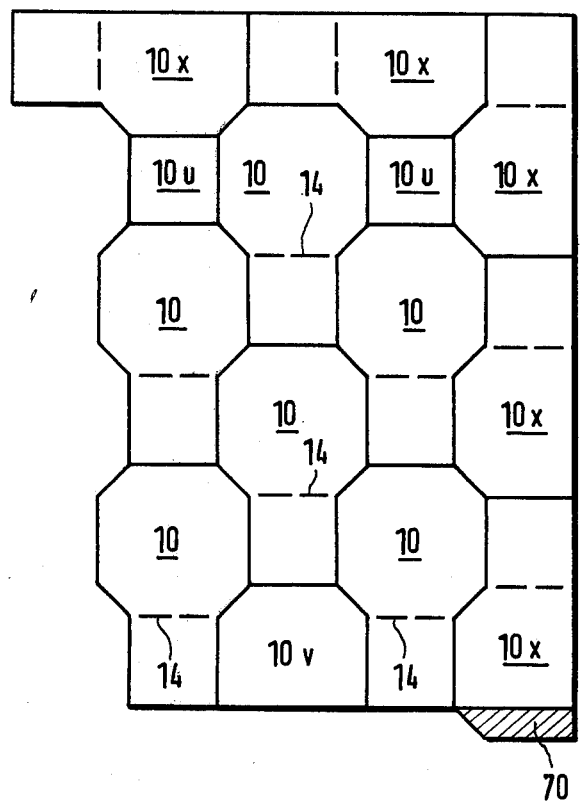
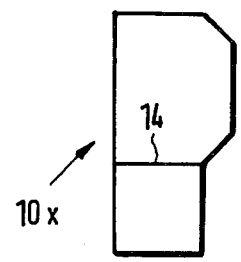
FIG. 20c
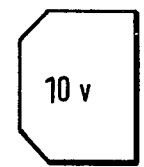
FIG. 20b
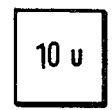
FIG. 20a
FIG. 19

SLAB-ELEMENTS FOR COVERING THE GROUND

This application is a continuation-in-part of Ser. No. 672,727 filed Apr. 1, 1976, and now abandoned.

BACKGROUND OF THE INVENTION

This invention relates to slab elements made of concrete for covering the ground. Such ground covering elements are used in the construction of traffic carrying surfaces, be it vehicular traffic or pedestrian traffic, for example roadways, squares, footways, entrance drives and the like, but if desired also in the construction of other ground covering structures such as embankments.

Many ground covering elements are known having properties that are satisfactory or even very good for forming ground covering composite structures, for example as regards resistance to breakage, interlocking and scope for laying different patterns. The criticism is however sometimes encountered that the pattern of the joints in a composite structure is not sufficiently stark or striking and that an incidentally desired decorative effect is not met or not fully met. This applies in particular if the pattern formed by the joints includes interengagement which decoratively is discordant. Admittedly there are also ground covering elements having contours that are more stark or striking in the composite structure, being in particular rectilinear; these however either afford a smaller choice of patterns they can form and/or they have less advantageous properties in the laid composite structure.

Thus the problem with which the invention is concerned is to provide a ground covering slab element that affords a good compromise between the wish for a good decorative effect on the part of the composite structure, desirable characteristics in the laid structure and large choice of laying patterns. The object of the invention is to provide an improved slab element which at least in some of its forms goes a good way to meeting that problem.

SUMMARY OF THE INVENTION

According to one of its aspects the invention provides a ground covering slab element formed as a single piece, said element having a head portion and a stem portion meeting at a dummy groove or dummy jointing gap allowing, but not necessitating, breakage of said slab element into head and stem along said dummy groove, said element being delimited by two opposite end faces of equal length joined by sides that form angled traces about a longitudinal axis common to said head and said stem, each said angled trace being formed by a succession of sides comprising at said head an inclined side face inclined in one direction relatively to said axis, a lateral side face extending lengthwise with respect to said axis and another inclined side face inclined in the opposite direction with respect to said axis, and comprising at said stem a lateral side face extending lengthwise with respect to said axis, said lateral face of said stem being complementary to said lateral face of said head, said end face of said head together with said inclined sides of said head and said laterial faces of said head and said meeting surface describing a centrally symmetrical octagon, and said dummy groove together with said end face of said stem and said lateral faces of said stem being symmetrical about the centre of said stem. Said end face of said stem, said lateral faces of said stem and said dummy groove together describe a square. Alternatively said end face of said stem, the lateral faces of said stem and said dummy groove merge without discontinuity and describe a circle.

Such elements, in at least some forms, whilst of a shape which in the composite structure looks striking, have no cross sectional constriction or seriously weakened cross section that is liable to rupture in the case of elements with square stems and none that are significant in the case of elements with circular stems; the corners are at least right angles or obtuse leading to lessened risk of breakage; there is a choice of several basically different laying patterns; and there is an absence of cross joints such as would adversely affect the cross linking in the composite structure.

The circular basic form of the stem, which is then also present at the sides of the head, can produce a clamp like interengagement in the composite structure when the stem of a slab element engages with the head of a neighbouring element.

Optimum combination of starkness of joint pattern and choice of laying patterns is obtained if each of said end faces, said inclined sides and said lateral faces, is rectilinear, and said head and said stem are mirror symmetrical about said longitudinal axis. However even here supplementary interengagement surfaces could be provided, particularly at the inclined sides of the head, in the form of alternating projections and recesses.

Preferably said inclined sides of said head are each shorter than said end face of said head. This provides balance of appearance with regard to the centre of gravity of the slab element and makes for ease of manipulation on laying. Also here the risk of rupture can be particularly low since the stem has a relatively large transverse dimension at the dummy groove. In an alternative construction however said end face of said head, said lateral faces of said head, said inclined sides of said head and said dummy groove together describe a regular octagon; this makes for a particularly high degree of symmetry and decorative effect. But it would be possible to make the inclined sides longer than the lateral faces of the head.

According to another of its aspects the invention provides a composite ground covering structure consisting of ground covering slab elements, said elements being laid to form a continuous covering, each said element being formed as a single piece, said element having a head portion and a stem portion meeting at a dummy groove of the type as specified above, said element being delimited by two opposite end faces of equal length joined by sides that form angled traces about a longitudinal axis common to said head and said stem, each said angled trace being formed by a succession of sides comprising at said head an inclined side face inclined in one direction relatively to said axis, a lateral side face extending lengthwise with respect to said axis and another inclined side face inclined in the opposite direction with respect to said axis, and comprising at said stem a lateral side face extending lengthwise with respect to said axis, said lateral face of said stem being complementary to said lateral face of said head, said end face of said head together with said inclined sides of said head and said lateral faces of said head and said dummy groove describing a centrally symmetrical octagon, and said dummy groove together with said end face of said stem and said lateral faces of said stem being symmetrical about the centre of said stem.

If decorative effect of the composite structure is regarded as particularly important the element may comprise differentiation means whereby said head is visually differentiated from said stem, so that a composite structure composed of identical said elements gives the appearance of consisting of non-identical elements. In addition to the dummy joints which are provided at the location of the meeting surface (which may constitute a predetermined rupture zone although not necessarily provided for this purpose but at least to provide the illusion in the decorative effect of independently laid head and stem elements), visual differentiation may be produced by a difference in height, surface texture (e.g. change over to smooth or tailings concrete) and/or coloration. In this way the elements can be used to produce the appearance of two ground covering slab elements of different contour as though laid independently in Roman pattern. In the Roman pattern octagonal elements are laid in conjunction with square elements. Compared to the latter, a composite structure laid with the elements embodying the invention exhibits at least equivalent or even better cross bonding resulting from its peripheral shape which is non central and non rectangular. This applies also to slab elements in which the head and stem are mirror-symmetrical with respect to the longitudinal axis and the end faces, inclined sides and lateral faces are all rectilinear; though devoid of engagement surfaces they can be laid in herringbone bond pattern which is advantageous in that it makes for a particularly well interlocked composite structure and indeed constitutes a preferred form of laying elements embodying the invention.

Whether laid in herringbone pattern or in a different pattern, the surfaces of different element groups may be visually different e.g. by being of different coloring. A particularly effective bond pattern can be formed by incorporating in said structure at least one supplementing slab element, said at least one supplementing element having the same peripheral configuration as said stems of said elements. Such supplemental slap elements may be conventional square building stones or rectangular blocks, commonly available in commerce, preferably of a visually different or contrasting surface appearance, to mark a centre of a composite structure or a zone intended to be emphasized.

BRIEF DESCRIPTION OF THE DRAWINGS

FIG. 15 shows a top view of the slab element of FIG. 1, but chamfered at the top edge, FIG. 16a shows a vertical section of the element of FIG. 15 along line S—S in FIG. 15, FIG. 16b shows the detail of the dummy groove encircled in FIG. 16a on a larger scale, FIG. 16c shows the connecting area of two adjacent elements of FIG. 15 on the same scale as FIG. 16b, FIG. 17 shows a vertical sectional view of a mold for manufacturing the slab element of FIG. 15, FIG. 19 shows a composite structure using elements as shown in FIG. 1 or FIG. 15, respectively, and including additional edge stones, FIGS. 20a and 20b show two edge stones of conventional type, and FIGS. 20c and 20d show two new edge stones for alternative use, integrally but separatably composed of two partial elements corresponding to the single elements of FIGS. 20a and 20b, respectively.

DESCRIPTION OF PREFERRED EMBODIMENTS

Figure 1:
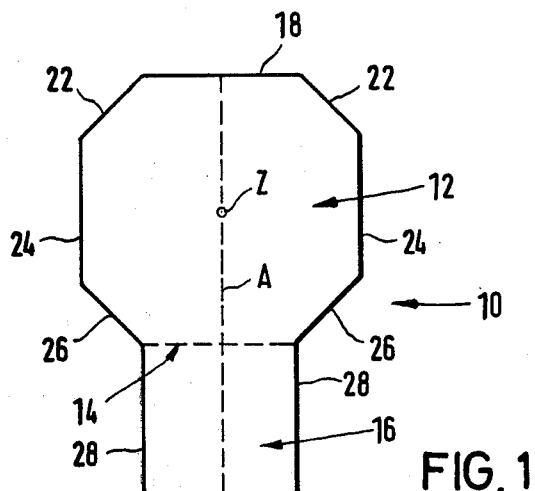
FIG. 1 is a plan view of a first ground covering slab element.
Figure 2:
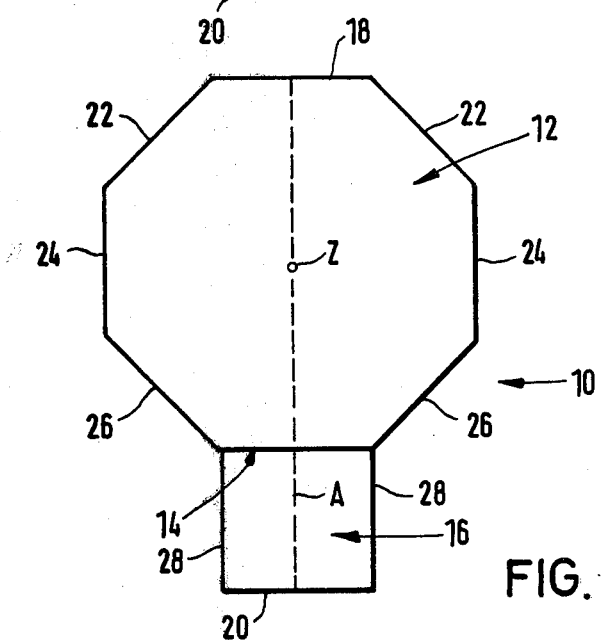
FIG. 2 shows in plan an alternative second slab element.

Each of the two alternative ground covering slab elements 10 shown in FIGS. 1 and 2 has a head portion or head 12 and a narrower shank portion or stem 16 made in one piece with the head meeting the stem along a dummy groove 14. The head 12 and the stem 16 are mirror-symmetrical relative to an imaginary common longitudinal axis A shown in broken line. The head 12 provides a first end face 18 and the stem 16 an opposite end face 20 of the ground covering element 10. The end faces 18 and 20 have the same length, extend rectilinearly normal to the axis A and, due to the mirror-symmetry relative to the axis A, are bisected by the latter. The connecting plane 14 of the head and the stem extends parallel to the two end faces 18 and 20 and has the same length as the latter.

At both sides of the axis A, the extremities of the two end faces 18 and 20 are joined by sides forming angled or polygonal traces. Adjacent each extremity of the end face 18 of the head there follow in succession an inclined side face or lateral face 22 inclined at 45° relative to the axis A, a lateral side face 24 parallel with the axis A, and another inclined side face or lateral face 26 inclined at 45° in the opposite sense relative to the axis A, these faces laterally delimiting the head 12. The inclined lateral face 26 of the head and the end face 20 of the stem 16 are joined by a lateral side face 28, parallel to the axis A, of the stem 16. All these faces are rectilinear.

The polygonal trace connecting the two end faces 18 and 20 of the ground covering element 12 and describing the side of the ground covering element, thus comprises (one after the other) the lateral faces 22, 24, 26 and 28. Since the stem 16 is dimensioned to be narrower than the head 12, the lateral face 28 parallel with the axis of the stem 16 is positioned to be nearer than the lateral face 24 parallel to the axis of the head 12; the lateral face 28 of the stem however is of the same length as the lateral face 24 of the head.

The end face 18 of the head, its two lateral faces 22 inclined relative to the axis A, its two lateral faces 24 parallel with the axis, and its two lateral faces 26 inclined in the opposite sense, relative to the axis A, describe together with the dummy groove 14 of the head 12 and the stem 16 an octagon which is centrally-symmetrical relative to the centre Z. The centre Z is located on the axis A. Due to the symmetry described, the lengths of the faces of the head 12 are at most two in number. Identical with each other are, first of all, the end face 18 of the head, the two lateral faces 24 thereof parallel to the axis A, and also the connecting face 14 thereof with the stem. Furthermore, the four lateral faces 22 and 26 inclined relative to the axis A of the head exhibit lengths which are identical with each other but which can if desired differ from the first-mentioned faces.

The embodiment of FIG. 1 differs from the embodiment of FIG. 2 with regard to the outer peripheral shape merely in that in the case of the embodiment of FIG. 1 the lateral faces 22 and 26 inclined relative to the axis A are shorter than the end face 18 which is of the same length as the axis-parallel lateral faces of the head, whereas in the case of the embodiment FIG. 2 all the delimiting faces of the head are identical with each other, thereby describing a regular octagon. The embodiment of FIG. 1 exhibits preferred dimensioning of the length of the inclined lateral faces 22 and 26 of the head relative to the end face 18 thereof, in the ratio of 1:2 or better between and 3:4 or, preferably, between 1 and 2:3.

In the case of both embodiments, the stem 16 describes a square delimited by the end face 20 of the stem, the two lateral faces 28 thereof and the connecting face 14 of stem 16 and head 12.

The head and the stem are a common massive concrete shaped member. The dummy groove 14 between the head 12 and the stem 16 not only sets off, i.e. visually differentiates the surface of the head 12 and of the stem 16 from each other — and in the composite structure gives the impression that the composite structure is laid not with integral ground covering elements of a single shape comprising head 12 and stem 16, but is laid with individual octagonal and square elements separately from each other — but also defines a predetermined rupture zone allowing, but not necessitating, breakage. In addition to the dummy groove 14, some other visual suface differentiation of head and stem may be provided.

The ground covering element of FIGS. 1 and 2 is shown merely in plan view. It will be understood that it can be dimensioned in the vertical direction in known manner, for example with a chamfer at the peripherally extending upper edge, or even with vertical engagement. However vertical lateral faces are greatly preferred possibly ending in chamferlike oblique surfaces.

Preferred is also the rectilinear configuration shown, which in the case of lateral faces as described, then results in having plane lateral faces. If limitations are acceptable with regard to the choice of laying patterns (described below), recesses can be provided in the periphery of the head at least at the lateral faces 22 and 26 inclined relative to the axis A, to provide for supplementary engagement in the composite structure.

Figure 2A:
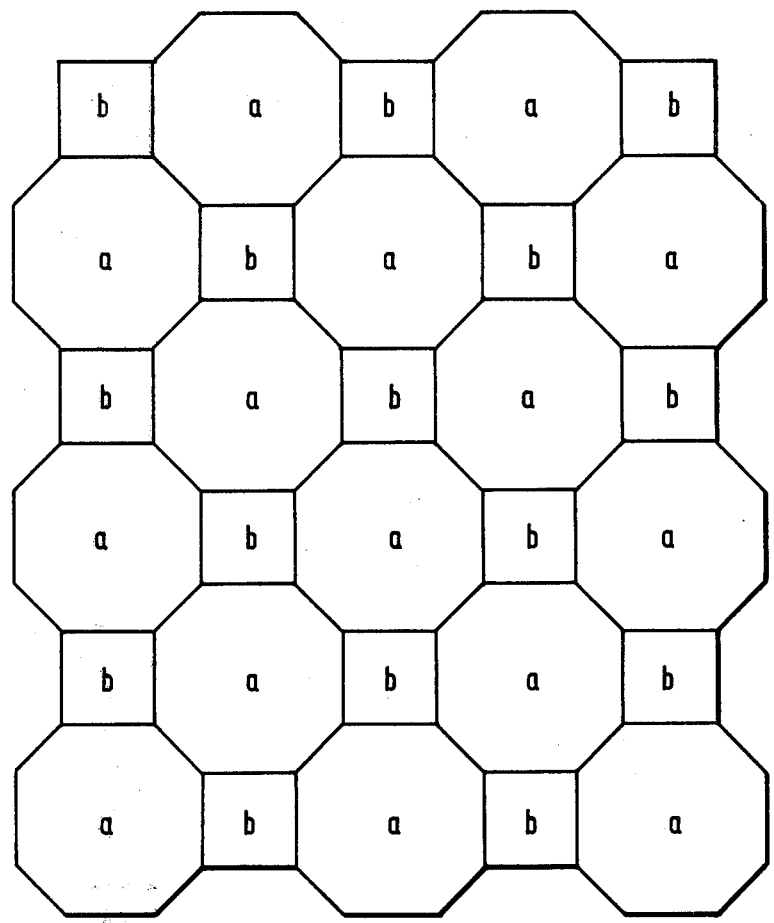
FIG. 2a illustrates in top plan a composite structure comprising ground covering elements according to FIG. 2.

FIGS. 3 to 7 show various composite structures made up of ground covering elements 10 of the basic construction described with reference to FIGS. 1 and 2. In all the composite structures if desired for the decorative effect, each of the individual ground covering elements 10 is provided with a dummy joint or dummy groove 14 at the connecting face of head and stem as in FIG. 2. This results, in the case of all the different bond patterns described below, in giving the impression illustrated in FIG. 2a that a Roman bond is made up on the one hand from octagonal ground covering elements a and on the other hand from square ground covering elements b which, in the case of all the composite structures, appear to be applied at the lateral faces parallel or normal to the axis A, whereas the octagons are located opposite each other only by abutment at the inclined lateral faces. In FIG. 2a, it is no longer possible to recognize which element b belongs, as stem 16, to which element a as head 12 of the same ground covering element 10, since the actual joints between different ground covering elements 10 and the dummy joints in the case of the same ground covering element have identical appearance, at least at first glance.

Figure 2B:
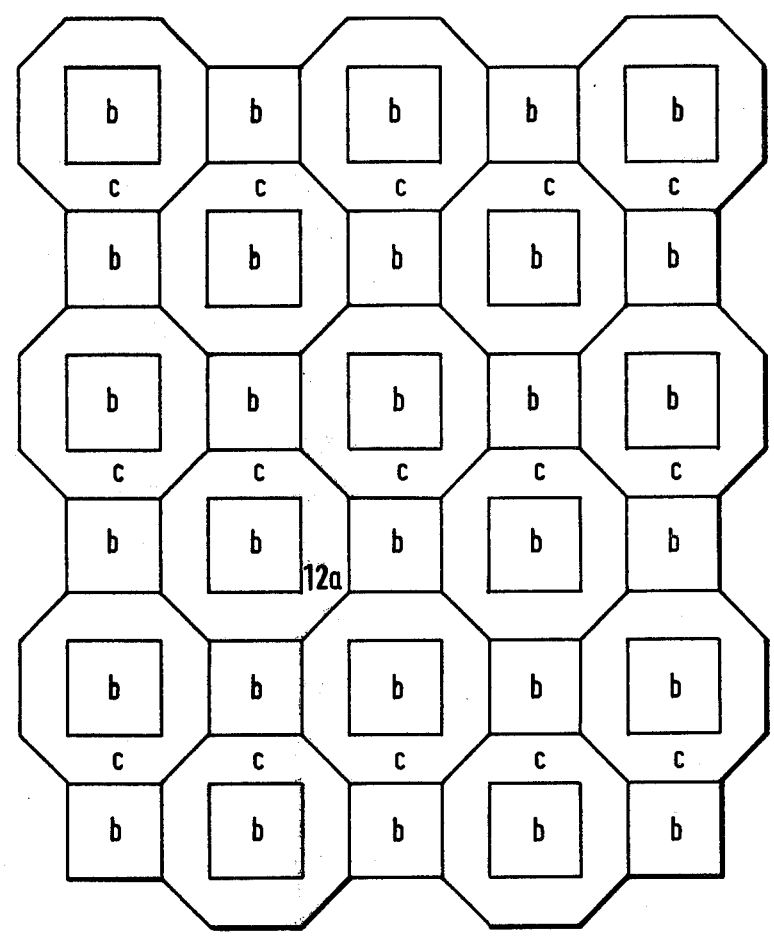
FIG. 2b depicts in top plan a composite structure comprising ground covering elements according to FIG. 2, having a supplementary square dummy joint in the centre of the head.

FIG. 2b shows a further development of the basic idea of FIG. 2a, whereby optical surface differentiation is provided in the case of identical ground covering elements, thereby producing, when laying the elements in the composite strucutre, the optical impression of an apparent Roman bond comprising nonidentical elements, like the elements a and b of FIG. 2a. In the composite structure of FIG. 2b, ground covering elements 10 are laid which are further developed relative to FIG. 2, in which in addition to the rectilinear dummy joint between the head 12 and the stem 16, a further dummy joint 12a is provided of the same area as the stem 16 and concentric with the top surface of the head 12, some of the sides of the dummy joint 12a being arranged parallel and some at right angles to the periphery of the stem 16. Thereby, in the example illustrated, the illusion is given of an externally octagonal ring component c having a square recess, and supplemented partly at the sides as in the case of element a of FIG. 2a and partly in the square recess, by unlike elements b.

In the case of a possible variant (not illustrated), also the elements b laterally adjacent the imaginary ring component c and the elements apparently inserted in the ring components c may have varying lateral length, and even varying peripheral shape. With this example, the possibilities for advantageous visual surface differentiation of identical ground covering elements 10 are not exhausted. A description will now be given of the various alternative specific patterns for laying the ground covering elements 10 (as distinct from the visually illusory effects), wherein the visual surface differentiation possibilities according to FIGS. 2a and 2b are additionally possible.

Figure 3:
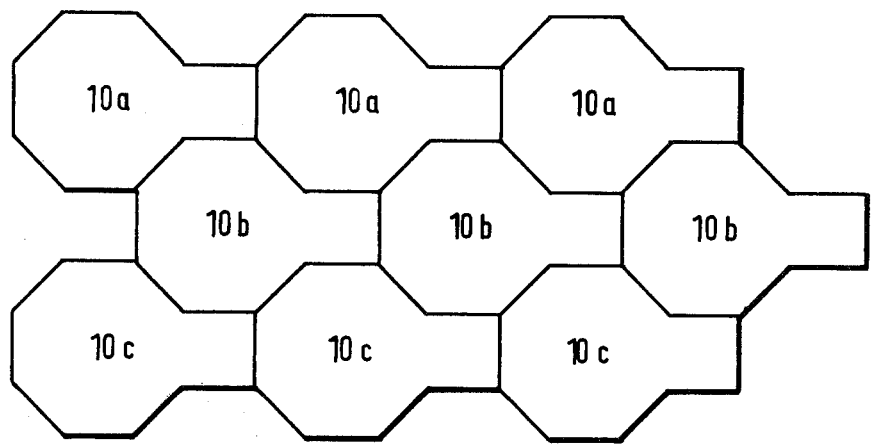
FIGS. 3 to 7 show composite structures comprising ground covering elements without the use of supplementing elements.

The composite structure according to FIG. 3 shows the simplest pattern of laying the elements 10a, 10b, 10c, etc. which as regards the alignment of head and stem are all identically oriented and follow one after the other in partially aligned rows designated by the suffixes a, b and c to reference numeral 10 of the ground covering element and furthermore emphasized by framing in thicker line. In the actual composite structure, of course, there is no visual difference between the joints formed between the individual rows and the joints between the stem of one and the head of a following ground covering element, unless it be desired expressly to emphasize such a difference, for example by arranging a chamfer only at one of these joint types.

Figure 4:
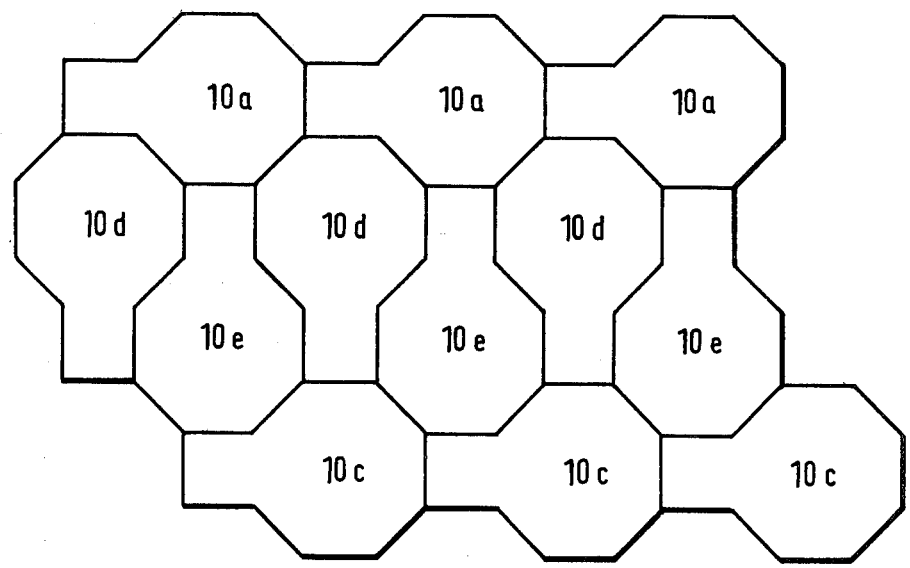
Figure 5:
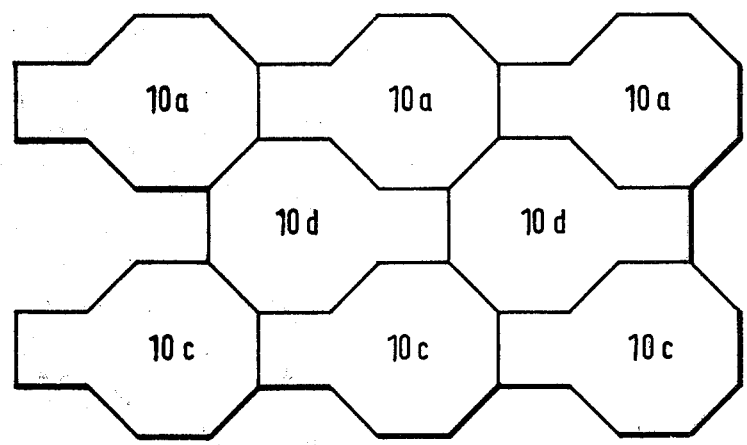

The embodiment of FIG. 5 differs from that of FIG. 3 only in that the orientation axis of head and stem is rotated through 180° at each alternate row. Thus, there follows here one upon the other the rows of ground covering elements 10 indicated by suffixes a, d and c, and in the case of FIG. 3 the rows distinguished by suffixes a and c have the same orientation of head and stem, whereas in an interposed row (here row d), this orientation is reversed, through 180°. Thus, a row of one orientation here always follows a row of a reverse orientation. Whereas in the composite structures of FIGS. 3 and 5, in each case a side of the head of a ground covering element fits into the niche formed at the stem of the ground covering element following in the next row, FIG. 4 provides an alternative in which it is not the side of the head but the endface thereof which fits into that niche.

Again, in the case of the composite structure of FIG. 4, two rows (designated a and c) of composite structure elements are laid with the same orientation of head and stem. Arranged between them are pairs of composite elements rotated through 90° relative to the direction in which the rows a and c extend, the elements of each pair being rotated in opposite directions. The two elements following each other alternately in this intermediate row are identified by the suffixes d and e. Here, the end faces of the stems of the elements 10 having suffixes d and e are located adjacent a lateral face, parallel to the axis A, of the elements 10 in the rows c and a respectively. In the composite structure of FIG. 4, a visually particularly desirable appearance can be achieved if the elements of one row, for example the elements of row a, are designed to be visually identical with the elements e of adjacent rows and optically different relative to the remaining elements d of adjacent rows, so that then a continuous row is obtained having arms projecting like pins on both sides, consisting of elements 10e whereof the end-faces are at the axis-parallel lateral faces of the heads of the ground covering elements 10a.

Figure 6:
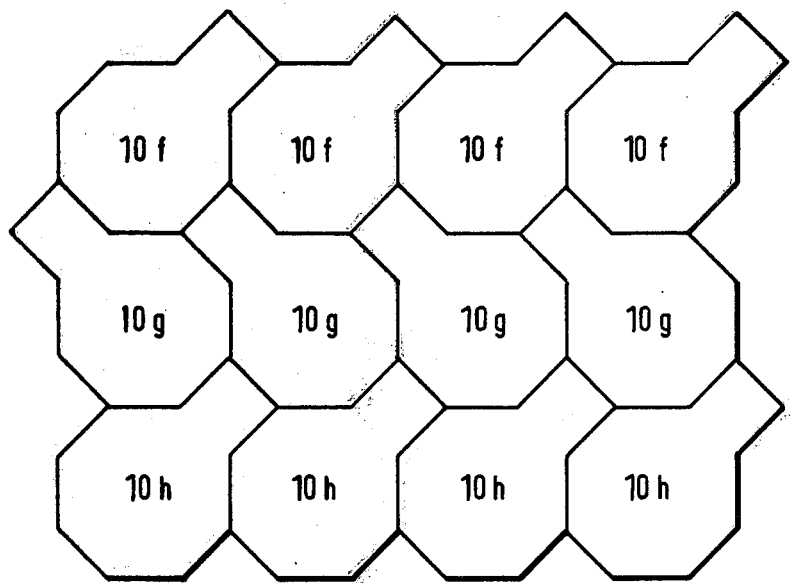

A further laying pattern which is preferred because of the uniformity of appearance and good bonding properties, is the herringbone bond of elements 10 of FIG. 6.

In this case, there is again alternating orientation of ground covering elements 10 following one upon the other in rows f, g and h. However, in contrast with the rows a and c of FIGS. 3 to 5, in this case the ground covering elements are not aligned axially with each other but are arranged at an angle of 90° in such manner that the axis-parallel lateral faces of the head are in each case located oppositely, on one side of the axis, with the axis-parallel lateral face of the stem of the ground covering element following in the same row and on the other side of the end face of the stem of the ground covering element following in the next row. With this arrangement, the axes of the invididual ground covering elements of successive rows are inclined alternately positively or negatively with respect to the direction in which the rows follow each other.

Relative to this direction in which the rows follow each other, the alignment of the stems of the rows f, g and h, in the case of the herringbone structure of FIG. 6, is always of like sense albeit alternately inclined through an angle of 45°.

Figure 7:
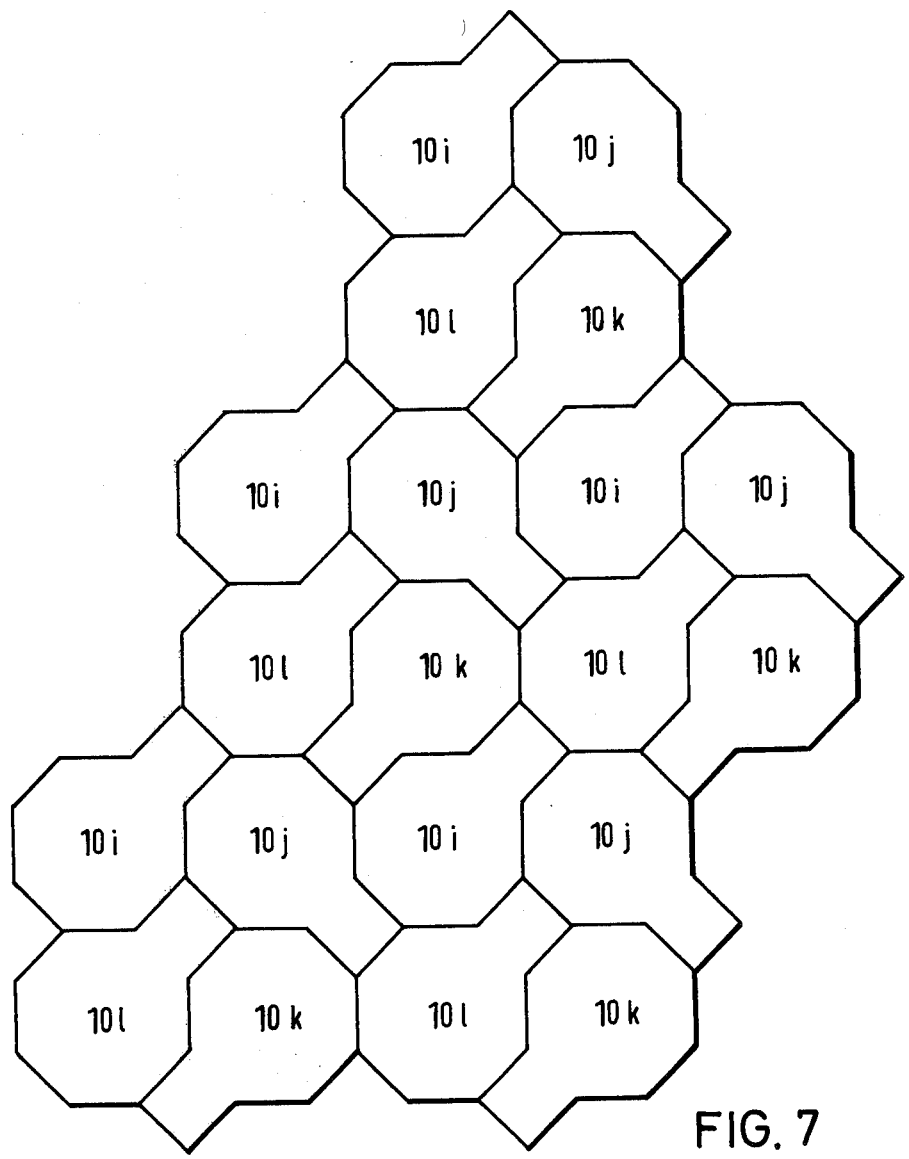

Finally, FIG. 7 shows a variant devoid of such a preference direction with regard to a series of successive floor covering elements.

In this case, there are in each particular instance four ground covering elements 10i, 10j, 10k and 10l assembled clockwise about a centre, and the composite structure continues in such groups of four.

As in the case of the individual rows of FIGS. 3 to 6, here the individual groups are rendered visible by thickened peripheral marking, but here again this group-wise combination need not necessarily be the result of the joint system of the composite structure. However, here again the elements assembled group-wise may be designed to provide for visual differentiation, for example by coloration.

It will be seen that in the composite structure of FIG. 7 all the possibilities for connecting composite elements such as are shown in FIGS. 3 to 6 are combined. Thus, in groups following one after the other the elements 10i and 10l of FIG. 7 and also the elements 10a of FIG. 3 and the elements 10i and 10l and elements 10f in FIG. 6 follow each other; within each group, the elements 10l and 10j and also the elements 10d and 10c in FIG. 4, the elements 10j and 10k and also the elements 10d and 10a in FIG. 4 and the elements 10l and 10k and also the elements 10a and 10d in FIG. 5 follow each other.

Figure 8:
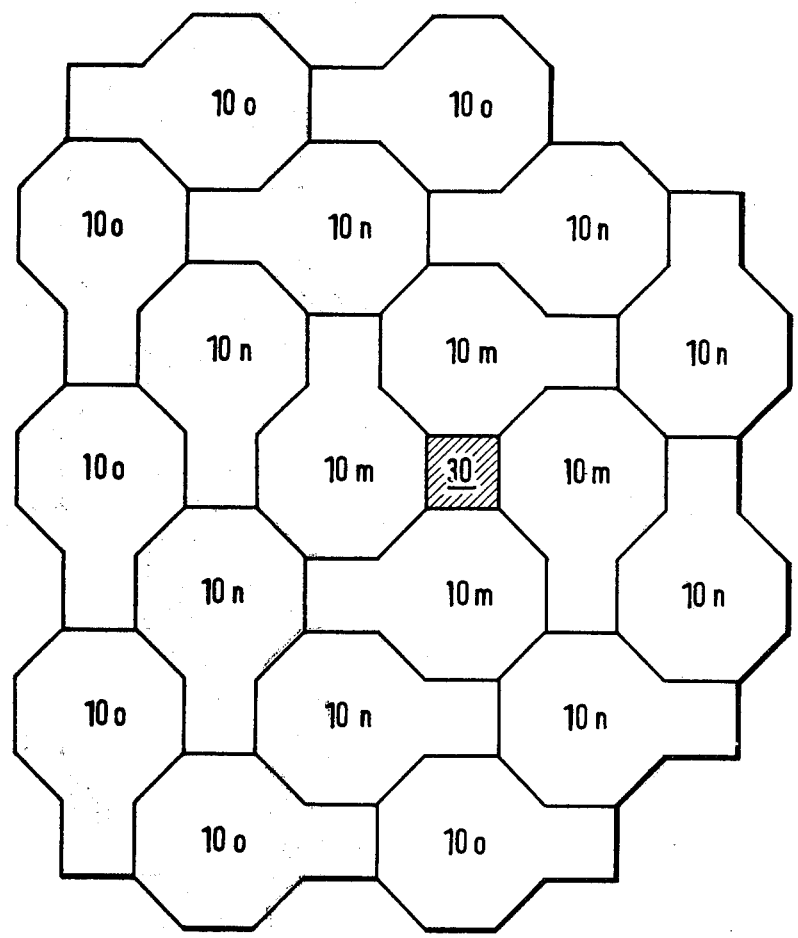
FIGS. 8 and 9 show composite structures comprising ground covering elements incorporating at least one supplementing element.
Figure 9:
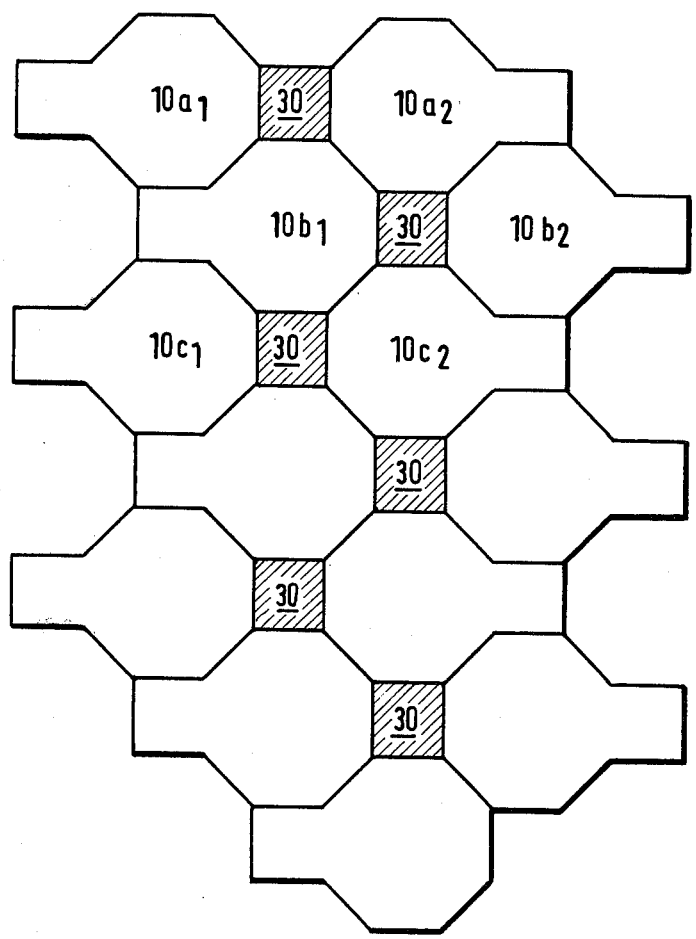

Finally, FIGS. 8 and 9 show composite structures wherein generally available square supplementing elements, such as square slabs or paving stones, can additionally be included in the composite structure. Such supplementing stones 30 are clearly indicated relative to the composite elements 10 by hatching in FIGS. 8 and 9. However, their surface appearance need not necessarily differ. However, such different surface appearance is frequently desired for example for making purposes.

In the case of the composite structure according to FIG. 8, a single supplementing stone 30 constitutes a centre of the composite structure about which the composite structure elements 10 are laid to form turns with predetermined rotational clockwise or anti-clockwise direction. The individual turns are designated m, n and o. It will be seen that in the case of the particular composite structure illustrated, the clockwise or anti-clockwise direction of stem alignment of the ground covering elements alternates in turn m relative to that of turn n, whereas the anti-clockwise or clockwise direction of turns n and o is identical. The selection of anti-clockwise or clockwise direction can be freely chosen in each particular instance.

In the case of the composite structure of FIG. 9, two partial composite structures according to FIG. 3, wherein three successive rows are again designated a, b and c and exhibit opposite stem orientation (indicated by varying suffixes 1 and 2) confront each other at the end faces, supplementing stones 30 being interposed between the end faces of confronting composite structure elements of the two partial composite structures according to FIG. 3. These supplementing stones extend in two neighbouring lines, so that each supplementing stone additionally passes into abutment at the axis-parallel sides of ground covering elements of neighbouring rows of the same partial composite structure. Thereby, each line can be regarded as associated with one partial composite structure.

Further details of the association of the individual end faces and lateral faces of the composite structure elements 10 in all the bonds shown according to FIGS. 3 to 9 will readily be apparent to the person skilled in the art from what is shown in FIGS. 3 to 9, to which reference is expressly directed.

It is also self-evident that the bonds shown and described can be continued in identical fashion in all directions.

Figure 10:
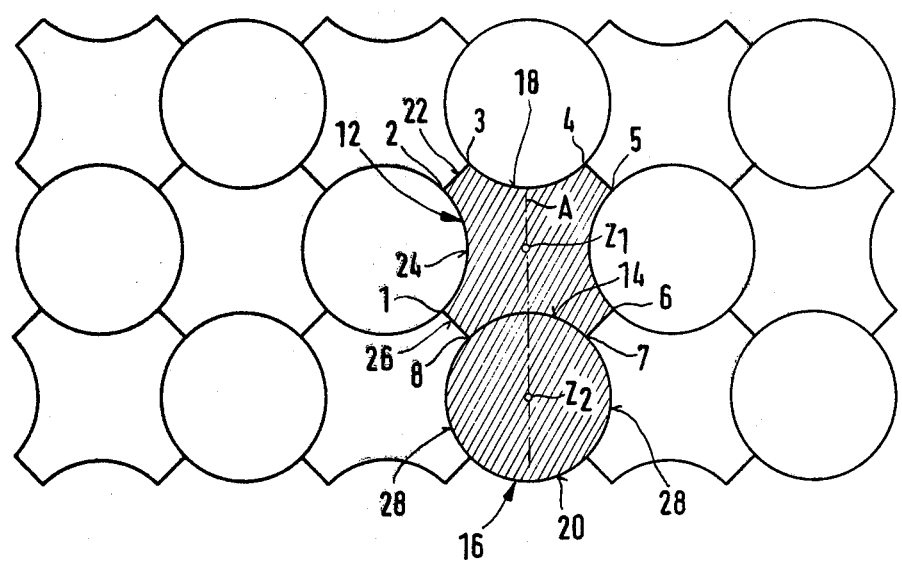
FIG. 10 is a plan view of an alternative ground covering element, in one of the several possible bond patterns.

A corresponding choice of several laying patterns is also possible in the case of the alternative ground covering element shown in the composite structure of FIG. 10 and there emphasized by hatching. That element has a circular stem 16 and a wider octagonal head 12. In the embodiment shown, the head and stem have a meeting surface designed again as dummy groove 14 of the type specified earlier along a quarter-periphery of the stem, whereas the free stem periphery forms, as a continuous arc of a circle, the two lateral stem faces 28 and the end face 20; it will be seen from FIG. 10 that the merging lateral and end faces 20 and 28 are distinguished from each other in the composite structure in that they abut with different, adjacent ground convering elements. The end face 20 of the stem 16 if translated along the mirror-image axis A of the ground covering element 10, conforms to the second end face 18 thereof at the head 12, describing a quarter-circle arc with the stem diameter; to the lateral faces 22, 24 and 26 of the head 12 of the embodiments according to FIGS. 1 to 9, there here correspond lateral faces of identical numbering. With this arrangement, the lateral faces 22 and 26 are of rectilinear design and are obliquely disposed relative to the axis A at angles of 45° and to each other at angles of 90°. The circularly scooped out lateral faces 24 extend lengthwise with respect to the axis A and are complementary to and of the same length as the end faces 18 and 20 of the ground covering element, whereas the lateral faces 22 and 26 are shorter. So here the angled trace extending from the end face 18 of the head to the end face 20 of the stem, is made up partly of part circular sections and partly of rectilinear sections. Supplementary interengagement parts could be added to the basic forms shown, as in the case of FIGS. 1 to 9. The entire ground covering element is mirror-symmetrical relative to axis A and additionally the head 12 is centrally symmetrical relative to its centre Z and the stem 16 is centrally symmetrical relative to the circle centre point (not shown). As regards the possible composite structures illustrated in FIGS. 8 and 9, instead of the square supplementing stones 30, circular ones would be used.

It is not essential that the arcuate connecting face 14, the end-face sides 18 and 20 of the ground covering element 10 and also the two lateral faces 24 of the head 12 thereof should describe a quarter-circle arc of the stem; it is for example also possible for the end-face 18, the two lateral faces 24 and the end-face 20 to have a centre angle smaller than 90° or, alternatively, that the said centre angle should also be somewhat greater than 90°. In the former case, the centre angle may for example be 45°, so that the arc length of the arc formed by the said lateral faces is an eighth of the full circle periphery and, then, the chord of the dummy groove 14 and also the end face 18 and of the lateral faces 24 of the head have the same length as the lateral faces 22 and 26 of the head 12 and describe therewith a uniform octagon.

Also in the case of the embodiment of FIG. 10, the head 12 and the stem 14 are expediently visually differentiated from each other along the line 14 by a dummy joint and, if desired, additionally by other known visual means so that the head and the stem of the ground covering element appear to be independent separate central-symmetrical laying elements.

Figure 11:
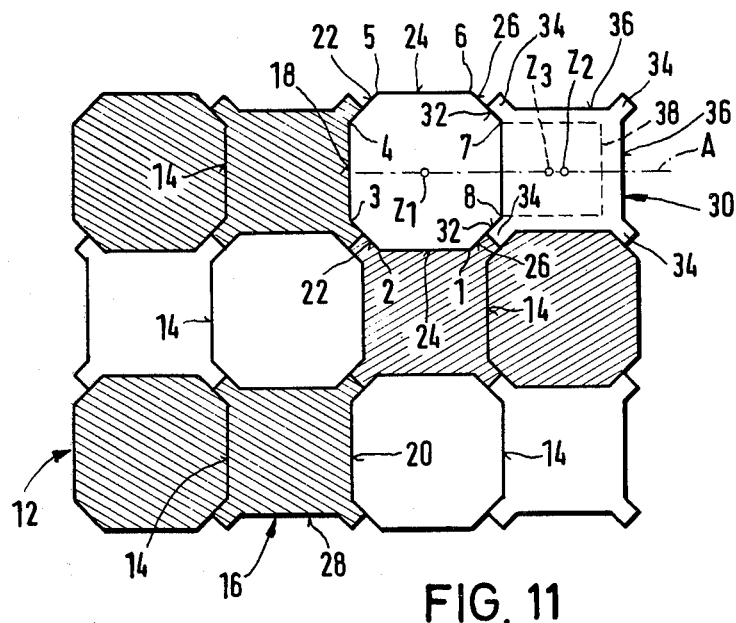
FIGS. 11 to 13 show three different composite paving structures, in the case of FIG. 13 an ordinary herringbone pattern, incorporating still another ground covering element, with adjacent elements interlocking as in the example of FIG. 10.
Figure 12:
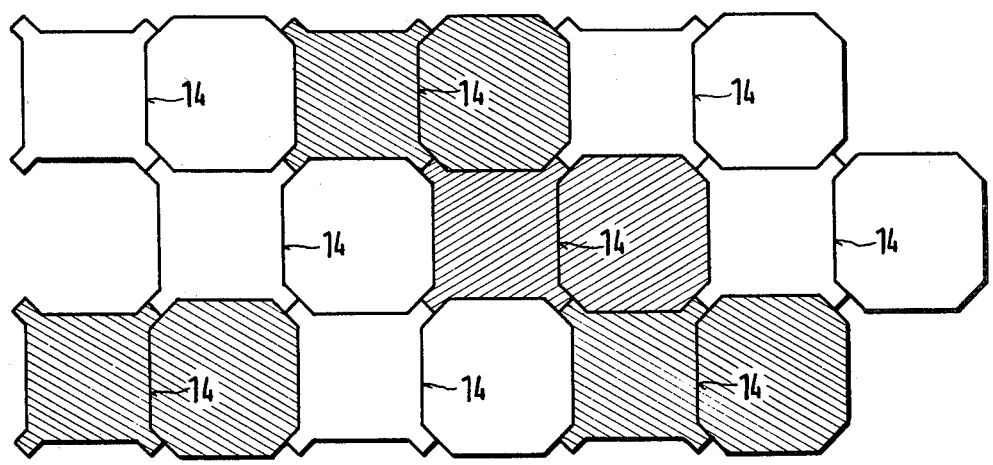
Figure 13:
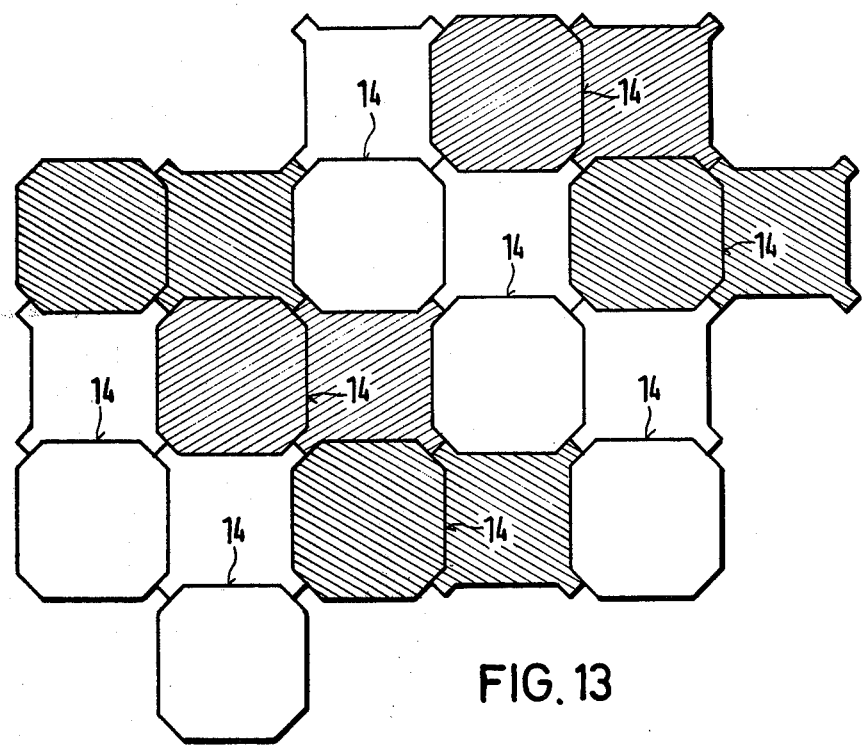

In the composite structures according to FIGS. 11 to 13 the individual ground covering slabs are characterized in part by uniform oblique hatching and in part by leaving out the hatching.

In analogy to the embodiment according to FIG. 11 the following applies: Each ground covering slab element has a head 12 and a narrower stem or foot 16. The head is centrosymmetrical with respect to its center $Z_1$, while the foot is centrosymmetrical with respect to its center $Z_2$. Furthermore, head and foot which are integrally joined are mirror symmetrical with respect to their central axis A passing through the two centers $Z_1$ and $Z_2$.

Head 12 describes an octagon having eight corners 1 to 8. In the embodiment shown the delimiting lines extending longitudinally and transversely of the central axis A, namely delimiting line 18 at the face end of the head between corners 3 and 4 and delimiting lines 24 at either longitudinal side of the head between corners 1 and 2 and 5 and 6, respectively, are longer than delimiting lines 22 between corners 2 and 3 and 4 and 5, respectively. The same applies mutatis mutandis to the other delimiting lines of the centrosymmetrical head. However, it is also possible for all the delimiting lines mentioned of the centrosymmetrical head to be of the same length, and it is even possible for delimiting lines 22 to be longer than delimiting lines 18 and 24, if desired.

Head 12 which is centrally symmetrical in itself and foot 16 which is likewise centrally symmetrical in itself meet each other along a dummy groove 14 at the top side of the slab element. The dummy groove allows but does not necessitate breakage of the slab element into head and stem or foot along its length. In addition, head and foot may be visually different, such as by a difference in coloration, roughness, e.g. different structure or kind of material, or height.

Dummy groove 14 extends between corners 7 and 8 and in part also between corners 1 and 8 and 6 and 7 of the octagon circumscribing head 12.

In FIG. 11 inamaginary square 38 having a center $Z_3$ is shown in broken lines within foot 16 and starting from corners 7 and 8. The center $Z_3$ is located closer to the head than center $Z_2$ of foot 16.

It can been seen in FIG. 11 that the indentation line of the foot extends entirely outside of the sides of the imaginary square. As compared to that the imaginary octagon circumscribing the basic format of the head coincides with the practical octagon between corners 1 to 8 which are formed outside of the area taken up by foot 16 by straight delimiting lines 26 (half the side between corners 6 and 7 as well as 1 and 8, joining corners 6 and 1, respectively,), 24, 22, 18, 22, 24, and again 26.

The indentation line designated 30 at foot 16 and the side halves 32 of the octagon between corners 6 and 7 and 8 and 1, respectively, and starting from corners 7 and 8 each define a square 34 from the outside along three sides. Corresponding squares 34 are to be found at the outer corners of foot 16 in central symmetry with respect to center $Z_2$. Between the defined squares 34 indentation line 30 of the foot extends along straight lines 36 which run parallel with the sides of the imaginary square 38. The straight lines 36 circumscribe a square, the center of which is $Z_2$ which is offset with respect to center $Z_3$ of the imaginary square and from the corners of which the defined squares 34 project at angles of 45° and in mirror symmetry with respect to the angle bisector.

Straight lines 36 at the sides 28 of foot 16 and at the end face 20 thereof cover the same length as end face 18 of the head between corners 3 and 4 and the delimiting lines 24 of the same length between corners 5 and 6 as well as 1 and 2. The length of the edges of the defined square 34 corresponds to half the length of the inclined faces of the head between corners 6 and 7, 1 and 8, 2 and 3, as well as 4 and 5.

With this arrangement indentation line 30 of the foot constitutes one projection each at each side of the foot, caused by a corner of the defined square 34, and an intermediate recess or indentation. This indentation is very much extended and its straight bottom practically has no notching effect on the foot.

FIGS. 11 to 13 show a selection of three different composite structures of a number of further possible composite structures of the ground covering slab element.

In the two composite structures according to FIGS. 11 and 12 the individual rows of the ground covering elements extend side by side so that the end face each of the head 12 of a ground covering element is placed adjacent the end face 20 of the foot of the next successive ground covering element in the same row. Besides, in adjacent rows each the longitudinal side 24 of a head 12 abuts the longitudinal side 28 of the foot of the adjacent ground covering element.

The composite structures according to FIGS. 11 and 12 differ in that with the structure shown in FIG. 11 the heads are directed alternatingly to the left and right, as seen in the drawing, so that in adjacent rows two ground covering element each are placed fully adjacent one another, whereas with the arrangement according to FIG. 12 the orientation of the heads in the individual rows is the same so that the ground covering elements each are offset by one half.

The two composite structures according to FIGS. 11 and 12, however, do not yet fully exploit all the possibilities of the ground covering element. This is done in the composite structure of FIG. 13 only in which not only the possibility of joining or the attachability of the longitudinal sides 24 of head 12 to the longitudinal sides 28 of foot 16 is realized but also the possibility of joining or the attachability of the head-end end face 18 of the ground covering element to the longitudinal side 28 of foot 16 as well as the foot-end end face 20 of the ground covering element to the longitudinal side 24 of head 12.

In FIGS. 11 to 13 the connection between head and foot in a single ground covering slab element is shown by the respective dummy groove 14 which joins head and foot.

It is a matter of course that the possibility of joining the longitudinal sides of the head to the longitudinal sides of the foot and of the head-end end face to the longitudinal side of the foot as well as of the foot-end end face to the longitudinal side of the head is warranted not only by the sections of the delimiting line marked by reference numerals but must be guaranteed on the whole in the composite structure. Within the framework of a square network pattern corresponding rhythms of the delimiting lines must be repetitive in the entire composite structure. Yet it is not necessary for these repetitions to be entirely within one ground covering element only. For instance, it will be readily recognized that with the ground covering element according to FIG. 11 the foot-end end face consisting of delimiting line 20 with two end sections at the flanks of the defined squares 34 is convertible by parallel displacement into the end face of the head consisting of delimiting line 18 with the two delimiting lines 22 provided at the ends. As delimiting lines 22 extend further outwards, a convertibility in the opposite sense is not possible. Therefore, the mosaic pattern describing the different possibilities of laying for instance of FIGS. 11 and 13 must not coincide with the lateral or front-end delimiting lines of head 12 and foot 16.

It also goes without saying that the composite structures shown and described can be continued in the same manner in every direction.

The elements to be laid in a composite structure are described in general only by their delimiting line. Perhaps apart from a chamfering at the upper edge of the element a constant solid cross section of all the ground covering elements considered will be provided. Yet as an alternative it is also possible to design the elements as known vertically interlocking stones.

Normally it is a condition for the possibility of laying the elements in the genuine herringbone pattern considered essential and shown in FIG. 13 that the "imaginary" octagon of head 12 which is described by its corners 1 to 8 and which, in the case of FIGS. 11 to 13, coincides with the actual indentation line 30 includes an angle of 135° each at the corners. Analogously in the case of FIG. 10 the projecting portion each of the circular delimiting line of the foot between the corners of the inscribed imaginary square constitutes a projection rather than a recess.

The ground covering slab elements preferably have the size of paving stones. Yet they may also correspond to the size of greater pavement plates.

If desired, it is possible to modify the embodiment according to FIGS. 11 to 13 by giving up the mirror symmetry with respect to longitudinal axis A, while retaining all the other features of the invention, and instead providing the foot which remains centrosymmetrical at both longitudinal sides with such an indentation line that the spacing of straight lines disposed at angles of 90° relative to the axis of the ground covering element along the foot is constant. The complementary indentation line in the head as well as the indentation at the end face of the foot then result as a matter of course from the other symmetries and from the joining conditions in the different composite structures considered, in particular in the herringbone structure.

As is well known, the basic form of the known ground covering element in accordance with FIG. 1 or 2 consists of an octagonal head with a square integrally attached to one side of the head. From the outward appearance this provides a non-rectangular ground covering element which does, however, have a number of possibilities of being laid, among them also in a herringbone pattern. As far as can be seen, the ground covering element in accordance with the entering clause is the only one permitting that among stones consisting of head and stem or head and foot. If the head is made relatively large as compared to the stem, the head will determine the load conditions. It is advantageous that the shape of the head has affinity to a square basic form rather than a rectangular one. The stem still makes it possible to take up thrust forces in the composite structure, especially when laid in herringbone pattern. Finally, head and stem can be separated optically by the dummy groove so that the impression of single elements of the form of head and stem being laid in a composite structure can be created.

The basic form including an octagonal head and a square attached to the same as stem or foot is not provided with any such delimiting lines as can hold other neighboring ground covering elements together in clamp-like fashion, as is the case with a genuine composite fitting stone. For this reason it was already considered above to provide the basic outline of octagon and square with additional interlocking faces in the form of alternating projections and indentations.

The embodiment shown in FIG. 10 as well as that according to FIGS. 11 to 13 are a further development of the head-foot ground covering slab element of such nature that an indentation line provided at the foot affords the least possible weakening of the foot by notching effect.

The fact that the interengaging indentation line of the foot extends only outside of the inner area of the square basic shape of the foot in form of an imaginary square, one side of which coincides with the side of the imaginary octagon of the head, makes it possible not to produce any notches of the indentation line projecting into the square basic shape so that the indentation line does not weaken the imaginary square of the foot in addition by the formation of notches. Even if the indentation line of the foot should itself follow a curved, a partly curved or partly rectilinear or a completely rectilinear zig-zag line, the resulting notches are offset toward the outside so that any remaining notching effect is reduced.

It is understood that an interlocking indentation line in the head of the ground covering element in accordance with the entering clause must correspond to the indentation line in the foot because otherwise the possibilities of joining would no longer be warranted. Yet a detailed description of the indentation line in the head itself may be dispensed with since it is essentially an automatic consequence of the selection of the indentation line of the foot because of the various features of the entering clause and, in particular of the possibilities of joining indicated.

In the ground covering elements according to FIGS. 1 and 2 the foot always has a width smaller than that of the head. For this reason the term "stem" was used. This relative dimensioning of foot and head may also be realized in the case illustrated in FIGS. 1 to 13. Yet it is not excluded that the foot may have the same width as the head or may even be larger than the head. For this reason the more general term "foot" may be used instead of "stem". However, the preferred embodiments still are those arrangements in which the foot is narrower than the head.

Furthermore the indentation line in the head which is complementary to the indentation line in the foot may result in the fact that the head is no longer octagonal but instead has a greater number of corners, in particular a total number of eight corners plus an even numbered multiple of four corners. This calculation includes such corners which come to lie in the joining area of the foot when the head is supplemented symmetrically.

The inner area of the imaginary square is understood to be the open amount of points surrounded by the square but not necessarily also the border, in other words the delimiting line of the assumed square itself.

In this sense the indentation line of the foot can touch the imaginary square. Complete agreement between the indentation line and the delimiting line of the imaginary square is not understood to be a case of touching. Touching rather is only understood to be a condition at which the indentation line lying partly outside of the imaginary square may coincide in another part with the delimiting line of the imaginary square.

This agreement may be given either line-wise or alternatively only in points. With the latter alternative the indentation line of the foot touches the imaginary square preferably only at the four corners thereof.

Furthermore, it is possible for the indentation line of the foot to form projections and recesses in the foot itself. However, preferably the indentation line of the foot constitutes only projections. This requires that one projection each of this number of projections is disposed between the corners of the square because otherwise additional setbacks would be created.

A possible arrangement of the kind mentioned last would be formed by a triangle attached to each free side of the imaginary square of the foot or by another convex attachment surface. In the critical case the foot may be a prism standing on its top if the symmetrical supplementing line to the connection between foot and head is assumed in addition. In that case the foot, for instance, may be a square standing on its tip. A particularly simple preferred embodiment in the sense of FIG. 10 is obtained if each projection is defined by a circular arc of a circle which is concentric with the imaginary square. In that event the basic form of the foot is a circular disc.

However, also arrangements in which a projection each is provided at the outer side faces of the imaginary square and an indentation each at the corners are comprised by the scope of the invention as well as arrangements in which an indentation each is provided at the corners of the imaginary square and several projections each with an indentation in between are formed at the outer sides of the imaginary square. A feature which all the embodiments in the sense of the interlocking effect as illustrated in FIGS. 10 to 13 have in common is that the necessity of indentations or recesses of an interlocking indentation line consisting of projections and indentations may be fulfilled at the expense of the octagonal basic form of the head but not at the expense of a reduction in size of the imaginary square of the foot. In the preferred embodiments in which the foot is smaller than the head the head has an inherent excess area which can take up the recesses of the interengaging indentation line without any great notching risk.

It is also within the scope of the invention if the indentation line of the foot instead of touching the imaginary square of the foot extends entirely outside of the sides of the imaginary square.

The corners of the imaginary octagon describing the head may be numbered continuously so that corners 7 and 8 are located next to the foot. Then it is preferably provided that the indentation line of the foot and the side halves of the octagon starting from corners 7 and 8 of the imaginary square define a square each from the outside along three sides between corners 6 and 7 and corners 8 and 1 of the imaginary octagon. Thus two of these defined and localized squares will be sandwiched between the corner areas of adjacent heads in the composite structure. This provides not only an essential improvement of the composite effect but also affords a unique appearance.

At this constellation the indentation line of the foot preferably may extend between the defined squares parallel to the sides of the imaginary square. This has the rather original result that the actual outline of the head remains that of a normal octagon delimited by straight lines without any indentations or recesses appearing. If, with this arrangement, an imaginary square is inscribed in the foot next to the connecting line of the actual octagonal head designating the transition between head and foot, the center of this square will be somewhat closer to the head than the actual center of a square described by the foot. From this square the defined squares will project at the corners under angles of 45° each.

Preferably it is also provided that the indentation line of the ground covering slab element is formed only by straight delimiting lines. However, as an alternative it is also possible to consider, within the scope of the further teaching of the invention, the use of curvilinear delimiting lines only or mixed cases of straight and curved delimiting lines.

A ground covering slab element in accordance with the preferred embodiment shown in FIG. 1, for example, has a length of faces 18, 20, and 24 of 7.5 cm and of faces 22 and 26 of 4.5 cm. This results in a total length along axis A of approximately 21 cm. Conveniently the smaller face, e.g. 26 corresponds to one fourth to three fourths, preferably one third to two thirds of the length of the greater face, e.g. 18. The lengths of the stone along axis A conveniently are between 18 and 30 cm. The heights of the stone conveniently are between 5 and 10 cm, for example in the ranges of 5, 6, 8, or 10 cm.

The concrete is preferably chosen in accordance with DIN 18501. This is a guarantee of good concrete quality and true measurement. The compressive strength may be grater than or equal to 600 kp/cm$^2$.

The additives preferably are selected according to DIN 4226. Typically approximately 350 kg of cement are used per cubic meter of concrete. About 50% of the admixture consists of sand of a particle size range from 0 to 4 mm and about 50% of gravel or other hard stone of a particle size ranging from 4 to 8 or perhaps from 4 to 16 mm. It is convenient to select the additives between screen characteristics D and E of the German Industrial Standard mentioned.

Figure 14:
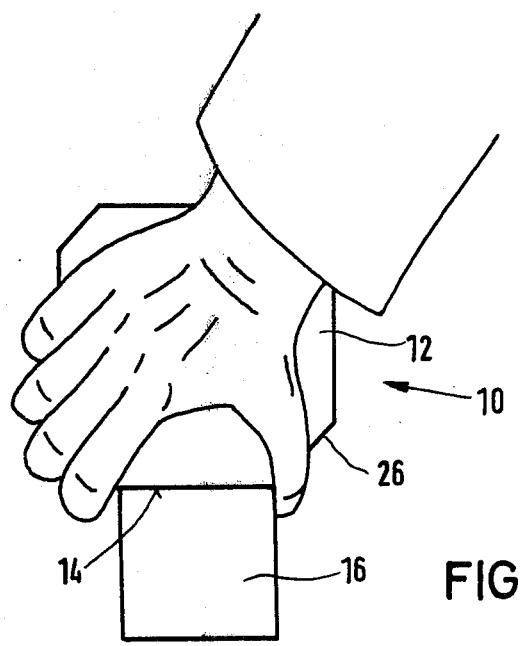
FIG. 14 is an illustration of a preferred dimension and surface distribution of a ground covering element to be gripped by only one hand of an operator.

It is not only the slab element according to FIG. 1 as shown in FIG. 14 but also all the other modified embodiments which make it possible for one person laying the stones to pick up the element with one hand. As shown in FIG. 14, the hand grips over the head of the element and the fingers come to lie against side faces 26 of head 12 which extend under 45° C. and are located next to stem or foot 16. This is a particularly favorable opportunity when the slab element according to FIG. 1 has the above mentioned proportions because then the center of the operator's hand lies approximately above the center of the mass of the entire element 10 consisting of head and stem. But also the other embodiments of the invention can still be laid by one hand only if they are dimensioned approximately analogously as described for the stone according to FIG. 1. The above mentioned limits for the determination of size are so selected that the possibility of laying the stones by one hand is guaranteed and, on the other hand, an individual stone will still cover the maximum area.

FIG. 15 shows a preferred modification of the already preferred embodiment according to FIG. 1, modified by chamfering 40 which extends along the entire upper edge of slab element 10. This chamfering 40 conveniently is obtained by bevelling of the edges under 45° as shown especially clearly in the vertical section of FIG. 16a.

The geometric form of the chamfering 40 extends not only alround the upper edge of the stone but continues along head 12 and stem 16 within dummy groove 14, both opposed flanks 42 and 44 of which essentially or preferably exactly correspond to the correspondingly inclined parallel chamfering 40, as to depth and inclination. As shown especially clearly in the sectional enlargement according to FIG. 16b the flanks 42 and 44 of dummy groove 14 have a frustoconical cross section with a horizontal groove bottom 46.

FIG. 16c shows that, apart from tolerances determined by the laying, exactly the same frustoconical cross section is formed by the opposed chamferings 40 and the intermediate joint sand 48 of two neighboring slab elements 10 in a composite structure. The width of the groove bottom 46 consequently corresponds to the average joint spacing between slab elements 10 laid adjacent one another. Thus an observer of the composite structure can hardly tell whether certain heads 12 and stems 16 belong to the same slab element or to neighboring slab elements.

Preferably neither chamfering nor a dummy groove are provided at the underside of the slab elements.

Figure 18:
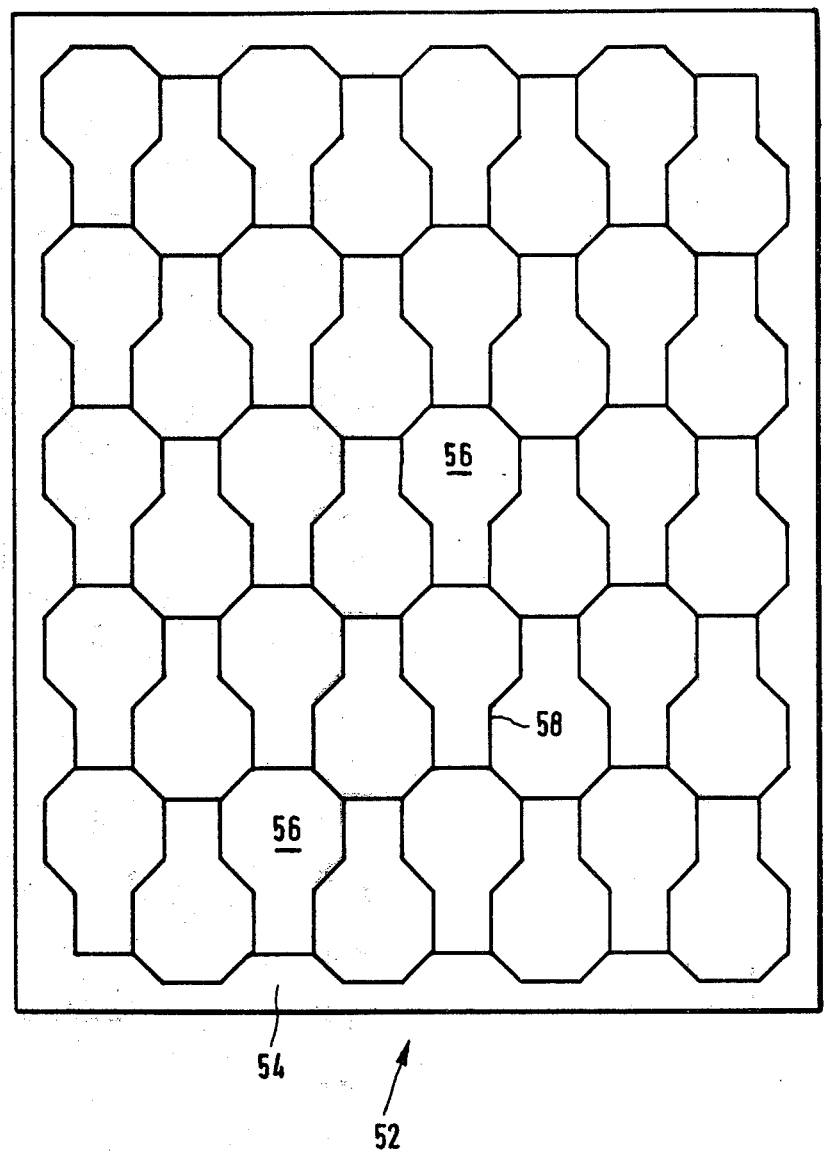
FIG. 18 is a top view of a mold frame for use in the mold of FIG. 17.

A typical production method of slab elements according to FIG. 15 results from the illustration of the mold shown in FIGS. 17 and 18. The mold frame 52, of which FIG. 18 is a top plan view, is placed on vibration table 50. The frame comprises a very solid continuous outer frame 54 subdivided at its inside into a great number of cells 56 having cell walls 58. The interior shape of the cell walls corresponds to the outlines of the slab elements according to FIG. 15 which are to be produced. The mold frame may be made of iron or steel. Each of the cells 56 is closed at its bottom by the vibration table 50. For reasons of saving space cells 56 are distributed in frame 54 in accordance with the rhythm of the structure shown in FIG. 5 so as to make the fullest possible use of the rectangular basis of the machine. The above mentioned limits of the dimensions are also adapted to the opening widths of commercially available machines.

First cells 56 are filled with raw concrete. To obtain the finished stone the mold is then vibrated and pressure is exerted on the upper side of the raw concrete filled into cells 56 by means of a temper head 60 which may be operated in any known manner, for example hydraulically, and which acts through individual rams 62 and a pressure plate 64 associated with each individual cell 56. It is convenient to make the arrangement such that one ram 62 will become effective above the stem 16 and another one above the head 12 of a slab element 10 to be produced. Release from the mold is effected by horizontal relative displacement of mold frame 52 and vibration table 50, a measure which alone avoids the formation of impressions at the underside of the element.

On the other hand, however, the geometric forms of dummy groove 14 and of the continuous chamfering 40 at the upper side of slab element 10 are formed by corresponding complementary projections 66 and 68 at the underside of pressure plate 64 when pressure is exerted on the raw concrete. The raw concrete mass is thus displaced by projections 66 and 68.

Edge stones and supplementing stones belong to each non-rectangular paving stone to be laid in a composite structure in order to be able to obtain a pavement with rectilinear or rectangular delimitations. Often supplementing stones of different shapes must be available, for instance in the case of a rectangular composite structure of slab elements 10 according to FIG. 19 the special forms 10u and 10v drawn specifically in FIGS. 20a and 20b must be available. All the other straight line marginal areas may also be composed of these especially formed stones. As will be seen, 10u has the square shape of a stem 16 of a slab element, whereas 10v has the shape of part of a head 12, namely that part of the head which is disposed above and at one side of stem 16 but not at the other side.

In this context it is left out of consideration that, as customary with such rectangular composite structures, a part designated 70 and marked by hatching in FIG. 19 must be hit off from the respective element disposed at two diagonally opposed corners of the composite structure. As an alternative, further special shapes of corner stones could be held on stock. Yet this is uneconomical and generally not practiced.

As a result of the embodiment selected in accordance with the invention of a slab element 10 whose head 12 and stem 16 can be separated by breaking along dummy groove 14, if required, the dummy groove 14 may continue into the area of edge stones used in a composite structure so as to give the entire composite structure a uniform appearance. Thus a single type of edge stone 10x or, as an alternative 10y according to FIG. 20c or FIG. 20d is sufficient. The edge stone 10x results from an assumed composition of stem element 10u with partial head element 10v at the normal location of dummy groove 14, whereas edge stone 10y results from an assumed attachment of stem element 10u to side face 24 of partial head element 10v.

As the assumed connecting line between partial elements 10u and 10v is formed by the actual dummy groove 14 along which edge stone 10x or 10y can be broken and separated again into partial elements 10u and 10v it is indeed sufficient with slab element 10 according to the invention to keep a single edge stone 10x or 10y on stock and to divide the same, if required, by breaking into the two partial elements 10u and 10v.

FIG. 19 illustrates the possibilities of laying a composite structure as shown in FIG. 3 with slab elements according to FIG. 1 or FIG. 15 and with edge stones 10x. Analogous conditions exist with other composite structures, other shapes of stones of the kind described and when the alternative edge stone 10y is used.

What we claim and desire to secure by Letters Patent is:

1. Slab elements for paving ground areas, each of said elements being a single piece of concrete consisting of a head portion and a stem portion meeting at a dummy groove allowing, but not necessitating, breakage of said slab elements into heads and stems along said dummy grooves and being delimited by two opposite end faces of equal length joined by opposite sides that form angled traces about a longitudinal axis common to said head and said stem, each said angled trace being formed by a succession of sides comprising at said head an inclined side face inclined at 45° in one direction relatively to said axis, a lateral side face extending lengthwise with respect to said axis, and another inclined side face inclined at 45° in the opposite direction with respect to the said axis, and comprising at said stem a lateral side face extending lengthwise with respect to said axis, each said lateral face of said stem being complementary to a lateral face of said head, said end face of said head together with said inclined sides of said head and said lateral faces of said head and said dummy groove describing a centrally symmetrically octagon, said dummy groove together with said end face of said stem and said lateral faces of said stem being symmetrical about the center of said stem, and said head and said stem being mirror symmetrical about said longitudinal axis.

2. Ground covering slab element as claimed in claim 1, wherein said end face of said stem, said lateral faces of said stem and said dummy groove merge without discontinuity and describe a circle.

3. Ground covering slab element as claimed in claim 2, wherein said end face of said head and said lateral faces of said head respectively define concave circular arcs of equal length and each complementary to the arc of said end face of said stem.

4. Ground covering slab element as claimed in claim 1, wherein said end face of said stem, said lateral faces of said stem and said dummy groove together describe a square.

5. Ground covering slab element as claimed in claim 4, wherein each of said end faces, said inclined sides and said lateral faces, is rectilinear.

6. Ground covering slab element as claimed in claim 5, wherein furthermore said dummy groove is rectilinear and parallel with said end faces.

7. Ground covering slab element as claimed in claim 1, wherein said end face of said head, said lateral faces of said head, said inclined sides of said head and said dummy groove together describe an octagon, with equal lengths of said end face, said lateral faces and said dummy groove, and with equal lengths of said inclined sides of said head.

8. Ground covering slab element as claimed in claim 7, wherein the octagon is a regular octagon in which all said lengths are equal.

9. Ground covering slab element as claimed in claim 7, wherein said inclined sides of said head are each shorter than said end face of said head.

10. Ground covering slab element as claimed in claim 1, wherein the top surfaces of said head and said stem are visually differentiated.

11. Ground covering slab element as claimed in claim 1, wherein said element is free from vertical openings extending therethrough.

12. A composite paving structure consisting essentially of ground covering slab elements, said elements being laid laterally side by side so as to form a substantially continuous paving, each said element being a single piece of concrete consisting of a head portion and a stem portion meeting at a dummy groove allowing, but not necessitating, breakage of said slab elements into heads and stems along said dummy grooves and being delimited by two opposite end faces of equal length joined by opposite sides that form angled traces about a longitudinal axis common to said head and said stem, each said angled trace being formed by a succession of sides comprising at said head an inclined side face inclined at 45° in one direction relatively to said axis, a lateral side face extending lengthwise with respect to said axis, and another inclined side face inclined at 45° in the opposite direction with respect to said axis, and comprising at said stem a lateral side face extending lengthwise with respect to said axis, each said lateral face of said stem being complementary to a lateral face of said head, said end face of said head together with said inclined sides of said head and said lateral faces of said head and said dummy groove describing a centrally symmetrical octagon, said dummy groove together with said end face of said stem and said lateral faces of said stem being symmetrical about the center of said stem, and said head and said stem being mirror symmetrical about said longitudinal axis.

13. A composite ground covering structure as claimed in claim 12, wherein said elements are laid in herringbone bond pattern with said axes of said elements in one row thereof disposed at an angle of 90° to said axes of said elements in an adjacent row thereof and with said stems of said elements in a row thereof inclined in like sense at an angle of 45° to the direction of the row.

14. A composite ground covering structure as claimed in claim 12, said structure further comprising at least one supplementing slab element, said at least one supplementing element having the same peripheral configuration as said stems of said elements.

15. A composite ground covering structure as claimed in claim 12, wherein a single type of edge stone is provided composed integrally of a head and a stem complementary to said slab elements with the exception of the edge line and being connected at a dummy groove substantially equally shaped as said dummy groove of said slab element.

16. A composite ground covering structure as claimed in claim 12, wherein the top edges of each said slab element are chamfered and each dummy groove has a frustoconical cross-section broader at the top, the flanks of which have substantially the same depths and inclinations as said chamfered edges, and wherein the bottom of the groove has a length substantially equal to the gap between adjacent elements of the composite ground covering structure.

17. A composite ground covering structure as claimed in claim 12, said elements further comprising differentiation means whereby their respective heads are visually differentiated from their stems so that said composite structure, though composed of identical elements, gives the appearance of consisting of differently shaped stones.

18. A composite ground covering structure as claimed in claim 12, said structure including at least one set of said elements consisting of four said elements laid at right angles to one another and each with said end face of its head confronting a side face of said stem of an adjacent element of the set so that said heads of the four elements define between their respective adjacent lateral side faces a space corresponding in area to one of said stems.

19. A composite ground covering structure as claimed in claim 18, and further comprising a supplementing stone filling said space and having a surface appearance whereby it is visually differentiated from said elements.

20. Slab elements for paving ground areas, each of said elements being a single piece of concrete consisting of a head portion being mirror symmetrical with respect to a central axis and symmetrical to its own center and having its outer delimiting lines form six corners with each other at six successive corners, one to six, of an imaginary centrosymmetrical octagon, the corners of which each include an angle of 135° and the side of which, formed by said other two corners, seven and eight, is bisected by said central axis, and a stem or foot portion adjacent said side of said octagon formed by said two corners seven and eight and likewise being mirror symmetrical with respect to said central axis and centrosymmetrical with respect to its own center, and comprising an interlocking indentation line constituted by the delimiting lines of said ground covering slab element and consisting of projections and indentations, with parallel displaceability of one end face line of said ground covering slab element into its other one, with attachability of the longitudinal side of said head portion to the longitudinal side of said foot portion, and with attachability of the head-end face of said ground covering slab element to the longitudinal side of said foot portion and of the foot-end end face of said ground covering slab element to the longitudinal side of said head portion, wherein said indentation line of said foot portion extends only outside of the inside area of an imaginary square, one side of which coincides with said side of said imaginary octagon between said corners seven and eight thereof.

21. Ground covering slab element as claimed in claim 20, wherein said indentation line of said foot portion touches said imaginary square.

22. Ground covering slab element as claimed in claim 21, wherein said indentation line of said foot portion touches said imaginary square only at the four corners thereof.

23. Ground covering slab element as claimed in claim 22, wherein said indentation line of said foot portion forms projections only, one of said projections each being disposed between the corners of said imaginary square.

24. Ground covering slab element as claimed in claim 23, wherein each said projection is delimited by a circular arc of a circle concentric with said imaginary square.

25. Ground covering slab element as claimed in claim 20, wherein said indentation line of said foot portion extends entirely outside of the sides of said imaginary square.

26. Ground covering slab element as claimed in claim 25, wherein said indentation line of said foot portion and those side halves of said imaginary octagon starting from said corners seven and eight of said octagon define a square each at three sides, from the outside, between corners six and seven and corners eight and one, respectively, of said octagon.

27. Ground covering slab element as claimed in claim 20, wherein said indentation line is constituted only by rectilinear delimiting lines.

28. Ground covering slab element as claimed in claim 26, wherein said indentation line of said foot portion extends between said defined squares parallel to the sides of said imaginary square.

* * * * *

UNITED STATES PATENT OFFICE
CERTIFICATE OF CORRECTION

Patent No. 4,128,357      Dated December 5, 1978

Inventor(s) Günter Barth and Fritz von Langsdorff

It is certified that error appears in the above-identified patent and that said Letters Patent are hereby corrected as shown below:

On The Title Page,
In the heading, directly beneath the line reading "[30] Foreign Application Priorty Date," insert -- Apr. 8, 1975 [DE] Fed. Rep. of Germany 2515210 --

*Signed and Sealed this*

*Twenty-sixth* Day of *October 1982*

[SEAL]

*Attest:*

*Attesting Officer*

GERALD J. MOSSINGHOFF

*Commissioner of Patents and Trademarks*

REEXAMINATION CERTIFICATE (220th)
United States Patent [19]
Barth et al.

[11] B1 4,128,357

[45] Certificate Issued  Jul. 17, 1984

[54] SLAB-ELEMENTS FOR COVERING THE GROUND

[75] Inventors: Günter Barth, Grötzingen; Fritz Von Langsdorff, Rastatt, both of Fed. Rep. of Germany

[73] Assignee: F. Von Langsdorff Bauverfahren GmbH, Rastatt, Fed. Rep. of Germany

Reexamination Requests:
No. 90/000,301, Dec. 2, 1982
No. 90/000,313, Jan. 12, 1983

Reexamination Certificate for:
Patent No.: 4,128,357
Issued: Dec. 5, 1978
Appl. No.: 882,250
Filed: Feb. 28, 1978

Certificate of Correction issued Oct. 26, 1982.

Related U.S. Application Data

[63] Continuation-in-part of Ser. No. 672,727, Apr. 1, 1976, abandoned.

[30] Foreign Application Priority Data

Mar. 29, 1976 [BE] Belgium ............................... 165663
Mar. 25, 1977 [DE] Fed. Rep. of Germany ....... 2713354

[51] Int. Cl.³ ............................................... E01C 5/00
[52] U.S. Cl. ...................................... 404/41; 52/608; D25/92
[58] Field of Search ................. 52/311, 590, 603, 604, 52/688; 404/22–24, 41–45, 38, 39

[56] References Cited

U.S. PATENT DOCUMENTS

| | | |
|---|---|---|
| D. 53,015 | 2/1919 | Overbury et al. |
| 474,339 | 5/1892 | Graham |
| 710,062 | 9/1902 | Leary |
| 3,897,164 | 7/1975 | Dodino ............................... 404/41 |

FOREIGN PATENT DOCUMENTS

| | | |
|---|---|---|
| 1365/26 | 4/1926 | Australia |
| 3697/31 | 8/1932 | Australia |
| 4956/31 | 9/1932 | Australia |
| 31821/67 | 7/1969 | Australia |
| 18418/70 | 2/1972 | Australia |
| 23313/70 | 6/1972 | Australia |
| Des. 65888 | 2/1975 | Australia |
| 285655 | 11/1970 | Austria |
| 315711 | 6/1974 | Austria |
| 630067 | 7/1963 | Belgium |
| 1119315 | 12/1961 | Fed. Rep. of Germany |
| 1851235 | 3/1962 | Fed. Rep. of Germany |
| 1878044 | 8/1963 | Fed. Rep. of Germany |
| 1926253 | 11/1965 | Fed. Rep. of Germany |
| 1948744 | 11/1966 | Fed. Rep. of Germany |
| 1953238 | 1/1967 | Fed. Rep. of Germany |
| 1957747 | 3/1967 | Fed. Rep. of Germany |
| 1983563 | 4/1968 | Fed. Rep. of Germany |
| 1988249 | 6/1968 | Fed. Rep. of Germany |
| 6750767 | 1/1969 | Fed. Rep. of Germany |
| 6942620 | 11/1969 | Fed. Rep. of Germany |
| 1658570 | 8/1970 | Fed. Rep. of Germany |
| 1459739 | 10/1970 | Fed. Rep. of Germany |
| 1921591 | 3/1971 | Fed. Rep. of Germany |
| 1784497 | 8/1971 | Fed. Rep. of Germany |
| 7206727 | 5/1972 | Fed. Rep. of Germany |
| 7409912 | 6/1974 | Fed. Rep. of Germany |
| 7412669 | 7/1974 | Fed. Rep. of Germany |
| 2141107 | 3/1973 | Fed. Rep. of Germany |
| 2305601 | 8/1974 | Fed. Rep. of Germany |
| 7418451 | 9/1974 | Fed. Rep. of Germany |
| 7406690 | 11/1974 | Fed. Rep. of Germany |
| 1917842 | of 0000 | Fed. Rep. of Germany |
| 92988 | 11/1959 | Netherlands |
| 237932 | 9/1945 | Switzerland |
| 1183489 | 3/1970 | United Kingdom |

OTHER PUBLICATIONS

Deutsche Bauzeitschrift (1971), p. 1916–"Architecktur Entwurf Detail".
Betonwerk & Fertigteil-Technik, May 1973–Lothar Spreeberg.
"New Mathematical Pastimes" by Major P. A. MacMahon, R. A. Cambridge University Press, 1921, pp. 68–79 and 112, 113 relied upon.
Structural Stoneware and the 8" Module, dated May 1970.
Hand Mold Metrics, dated Jan. 1975.

*Primary Examiner*—Ernest R. Purser

[57] ABSTRACT

A slab element for covering the ground is made e.g. of concrete and forms as a single piece. It has a head portion and a stem portion meeting at a notional meeting surface. The element is delimited by two opposite end faces of equal length joined by sides that form angled traces about a longitudinal axis common to the head at the stem, each said angled trace being formed by a succession of sides comprising at said head an inclined side face inclined in one direction relatively to the axis, a lateral side face extending lengthwise with respect to the axis and another inclined side face inclined in the opposite direction with respect to the axis, and comprising at the stem a lateral side face extending lengthwise with respect to the axis which is complementary to the lateral face of the head, the end face of the head together with its inclined sides and its lateral faces and the meeting surface describing a centrally symmetrical octagon, and the meeting surface together with the end face and lateral faces of the stem being symmetrical about the center of the stem. The head may describe a regular octagon. The stem may describe a square. But the stem may also describe a circle. The elements can be laid to form a composite ground covering structure, laid e.g. in herringbone bond pattern, and laid e.g. to include one or more supplementing slab elements of the same peripheral configuration as the stems of the elements.

REEXAMINATION CERTIFICATE ISSUED UNDER 35 U.S.C. 307.

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9, 13, and 20–28 is confirmed.

Claims 1–8, 10–12 and 14–19 are cancelled.

New claims 29–33 are added and determined to be patentable.

*29. Paving stones for covering ground areas by being laid onto them each stone beside others, each said stone being a unitary shaped piece of concrete substantially longer than it is wide and mirror symmetrical relative to its central longitudinal axis,*

*each said stone consisting of a centrally symmetrical head portion centered on said axis and a centrally symmetrical stem portion centered thereon and of less width than said head portion,*

*said head portion being delimited by seven rectilinear side faces and a rectilinear notional plane throughout which said head portion is integral with said stem portion, one of said side faces being an end face of the stone, two being inclined outward from said end face at an angle of 45° to said axis, two being lateral faces extending parallel to said axis from said inclined faces, and two being inclined inward from said lateral faces at an angle of 45° to said axis with their respective inner ends delimiting said notional plane,*

*said stem portion being delimited by said notional plane and three rectilinear side faces of which two are lateral faces extending parallel to said axis from said inner ends and the third is the other end face of said piece,*

*said lateral faces, said end faces and said notional plane all being of equal length,*

*said inclined faces all being of equal length but substantially shorter than said end faces and said lateral faces,*

*each said stone having a rectilinear dummy jointing gap formed in and across its upper side between the said inner ends, each said stone being layable beside others of said stones in any of several different patterns of load-resistant interengagement, including a herringbone bond pattern, in all of which the stones give the surface appearance of octagonal stones laid beside square stones, said dummy jointing gap in each stone constituting a predetermined rupture zone along which the stone if overloaded in a pavement can break without noticeable change of said surface appearance.*

*30. A paving stone according to claim 29, said side faces of each of said stones being substantially vertical and having oblique chamfered surfaces along their upper edges.*

*31. Slab elements for paving ground areas, each of said elements being a single piece of concrete consisting of a head portion and a stem portion meeting at a dummy groove allowing, but not necessitating, breakage of said slab elements into heads and stems along said dummy grooves and being delimited by two opposite end faces of equal length joined by opposite sides that form angled traces about a longitudinal axis common to said head and said stem,*

*each said angled trace being formed by a succession of sides comprising at said head an inclined side face inclined at 45° in one direction relatively to said axis, a lateral side face extending lengthwise with respect to said axis, and another inclined side face inclined at 45° in the opposite direction with respect to the said axis, and comprising at said stem a lateral side face extending lengthwise with respect to said axis, each said lateral face of said stem being complementary to a lateral face of said head,*

*said groove, said end faces, said inclined faces and said lateral faces each being rectilinear,*

*said end faces, said lateral faces and said groove having equal lengths,*

*said inclined side faces having equal lengths but each being substantially shorter than said end face of said head, said end face of said head together with said inclined sides of said head and said lateral faces of said head and said dummy groove describing a centrally symmetrically octagon, said dummy groove together with said end face of said stem and said lateral faces of said stem describing a square and being symmetrical about the center of said stem, and said head and said stem being mirror symmetrical about said longitudinal axis.*

*32. A composite ground covering structure comprising a multiplicity of paving stones according to claim 29, 30, or 31, laid on a ground surface each beside others and forming a substantially continuous pavement of interengaged stones over said ground surface, said pavement irrespective of the pattern or patterns of interengagement of said stones giving substantially the same surface appearance as a pavement composed of octagonal stones and square stones.*

*33. A composite ground covering structure according to claim 32, at least some of said stones being interengaged in herringbone bond pattern with the longitudinal axes of stones in a row disposed at an angle of 90° to said axes of stones in an adjacent row and inclined in like direction at an angle of 45° to the direction of the row.*

* * * * *